Figure 1:
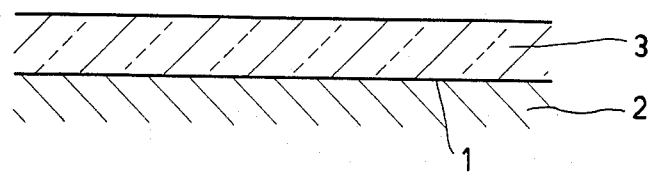
Figure 2:
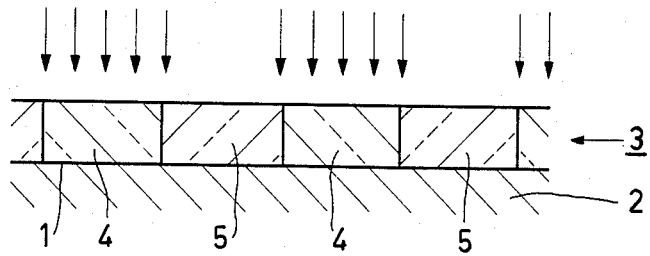
Figure 3:
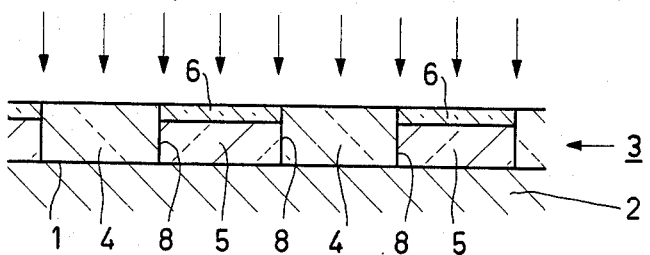

United States Patent [19]

Vollenbroek et al.

[11] Patent Number: 4,499,177
[45] Date of Patent: Feb. 12, 1985

[54] METHOD OF MANUFACTURING A SEMICONDUCTOR DEVICE

[75] Inventors: Franciscus A. Vollenbroek; Elisabeth J. Spiertz, both of Eindhoven, Netherlands

[73] Assignee: U.S. Philips Corporation, New York, N.Y.

[21] Appl. No.: 517,611

[22] Filed: Jul. 27, 1983

[30] Foreign Application Priority Data

Sep. 10, 1982 [NL] Netherlands ............... 8203521

[51] Int. Cl.$^3$ .................................. G03C 5/00
[52] U.S. Cl. .................................. 430/311; 430/312; 430/328; 430/330; 430/326
[58] Field of Search ............... 430/311, 312, 313, 328, 430/330, 326, 323

[56] References Cited

U.S. PATENT DOCUMENTS 4,212,935 7/1980 Canavello et al. ............... 430/191

OTHER PUBLICATIONS

Bergin et al., IBM Tech. Discl. Bulletin, vol. 18, No. 5, Oct. 1975, p. 1395.

Primary Examiner—Won H. Louie
Attorney, Agent, or Firm—Paul R. Miller

[57] ABSTRACT

A method of manufacturing a semiconductor device in which a photosensitive lacquer layer is developed in a lye solution, and comprises a polymeric material and a sensitizer with a diazo group and a ketone group. This lacquer layer is formed on a substrate surface. After a patterning irradiation, but before development, the lacquer layer is subjected to an intermediate treatment comprising two irradiations. These irradiations result in that differences in solubility in lye are obtained in the direction of thickness in the parts of the lacquer layer which were not exposed during the patterning irradiation. In this manner, it is possible to realize lacquer patterns with different profiles.

9 Claims, 12 Drawing Figures

METHOD OF MANUFACTURING A SEMICONDUCTOR DEVICE

The invention relates to a method of manufacturing a semiconductor device, in which a substrate surface has formed on it a photosensitive lacquer layer, which can be developed in a lye solution, and which comprises a polymeric material and a sensitizer with a diazo group and a ketone group. The lacquer layer is irradiated in accordance with a pattern and is subjected then, but before a lacquer pattern is formed by development, to an intermediate treatment, which results over its entire area in that differences in solubility in lye are obtained in the direction of thickness in parts of the lacquer layer which had not been irradiated.

Such a method is particularly suitable for the manufacture of semiconductor devices with details of the order of micrometers. The intermediate treatment renders it possible to modify lacquer profiles which are obtained with a conventional exposure and development.

A method of the kind mentioned in the preamble is known from U.S. Pat. No. 4,212,935, in which in the intermediate treatment the lacquer layer is treated with an organic solvent—in particular with chloroenzene—, as a result of which a top layer is formed in the lacquer layer having a higher resistance to lye than the untreated parts of the lacquer layer lying below the top layer. During the development of the lacquer layer thus treated, overhanging lacquer profiles are obtained, which are suitable for example, for the formation of metal tracks with the aid of lift-off techniques.

In order to be able to use the described known method successfully, the lacquer layer should be sufficiently accessible to solvents during the intermediate treatment. This means that, after having been applied to the substrate surface, the lacquer layer cannot be subjected to a normal treatment, but that a heat treatment is allowed to be carried out for a comparatively short time at a comparatively low temperature. This results in the lacquer layer having a comparatively poor adhesion to the substrate surface so that during development the lacquer layer can become locally detached from the substrate surface.

The invention has for its object to provide a method by means of which—without the use of dangerous solvents—lacquer profiles are modified, and in which the laquer pattern manufactured has a satisfactory adhesion to the substrate surface.

According to the invention, the method mentioned in the preamble is therefore characterised in that during the intermediate treatment a bond is formed between the sensitizer and the polymeric material in a top layer of the lacquer layer by a first irradiation, after which at least a part of the sensitizer is converted into an acid in parts lying below the top layer by a second irradiation.

During the first irradiation, the parts of the lacquer layer exposed during the patterning irradiation—where the sensitizer has been wholly consumed—are not influenced, but a top layer which is less soluble in lye is formed in the parts of the lacquer layer which then have not yet been irradiated. By the second irradiation, the solubility in lye of the parts of the lacquer layer lying below this top layer is increased. Since after the first irradiation the sensitizer is bonded in the top layer and thus had disappeared, no acid can be formed in the top layer during the second irradiation so that the properties of the top layer then do not change any more. After the intermeidate treatment, differences in solubility in lye are therefore obtained in the direction of thickness in parts of the lacquer layer not exposed to a patterning irradiation. By a suitable choice of the irradiation doses of the first and the second irradiations, both vertical and overhanging lacquer profiles can be realized. During the intermediate treatment in accordance with the invention, use is made of radiation. Radiation can penetrate into the lacquer layer if this layer, after it has been applied to the substrate surface, is subjected to a conventional heat treatment. Therefore, a conventional satisfactory adhesion of the lacquer layer to the substrate surface can be obtained.

A preferred embodiment of the method in accordance with the invention is characterised in that the first irradiation is carried out with UV radiation which substantially does not comprise radiation having wavelengths of more than 280 nm, while during this irradiation the lacquer layer is substantially anhydrous.

Under these conditions, the desired top layer is obtained with this radiation. Such short-wave UV radiation is absorbed by the polymeric material in substantially the same manner both in the parts of the lacquer layer which have been exposed and in those which have not been exposed to patterning irradiation. If this should not be the case and if the parts of the lacquer layer exposed to patterning irradiation should be transparent to the radiation used, the parts of the lacquer layer then not irradiated which are located near the boundaries between the parts of the lacquer layer which have been exposed and the parts which have not been exposed to the patterning irradiation would likewise be irradiated. The top layer which is substantially insoluble in lye could then extend along these boundaries down to the substrate surface. As a result, it would no longer be possible to influence the lacquer profiles in a desired manner. In this case, both during the patterning irradiation and during the first irradiation, perpendicularly incident parallel radiation would have to be used.

A further preferred embodiment of the method in accordance with the invention is characterised in that the secod irradiation is carried out with UV radiation which mainly comprises radiation of wavelengths larger than 280 nm, while during this irradiation the lacquer layer is in contact with a water-containing atmosphere.

This radiation can penetrate through the top layer sufficiently deep into the lacquer layer to bring about the desired conversion. This irradiation can be carried out simply in normal air at normal air humidity.

A further preferred embodiment of the method in accordance with the invention is characterised in that during the intermediate treatment between the first and the second irradiations a part of the sensitizer which is present below the top layer in the lacquer layer is decomposed with the aid of a heat treatment.

The heat treatment thus determines the quantity of sensitizer that can still be converted into acid by the second irradiation. That is to say that the heat treatment determines the degree of solubility in lye if during the second irradiation the remaining quantity of sensitizer is converted. With short irradiation times, undesired differences in solubility can be obtained in the lacquer layer due to standing waves. Since the solubility in lye is determined by the heat treatment, the irradiation time of the second irradiation can be chosen to be so long that such standing wave effects are avoided.

Further, during the patterning irradiation of the photosensitive lacquer layer, preferably only surface parts are rendered developable by this irradiation. The parts of the lacquer layer lying below the surface parts thus formed are then likewise rendered soluble in lye by the second irradiation carried out during the intermediate treatment so that the same situation is obtained as when the lacquer layer would have been rendered developable as far as the substrate surface during the patterning irradiation. By this step it is achieved that a patterning irradiation can be carried out in a much shorter time, which means a more efficient use of the exposure equipment. Moreover, this step renders it possible to use radiation which is absorbed very strongly by the lacquer layer and with which it is only possible to produce a superficial image in a conventional irradiation time. As a result, radiation of a wave-length shorter than usual wavelengths, can be used for the patterning irradiation, which renders it possible to work with smaller details.

Figure 7:
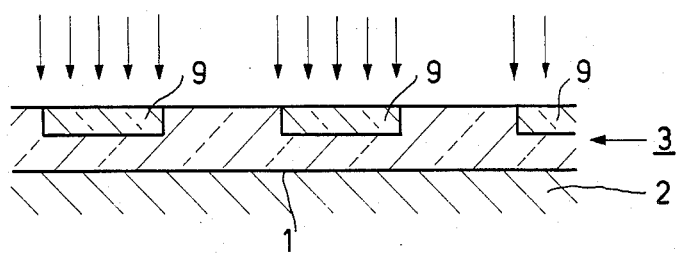
Figure 8:
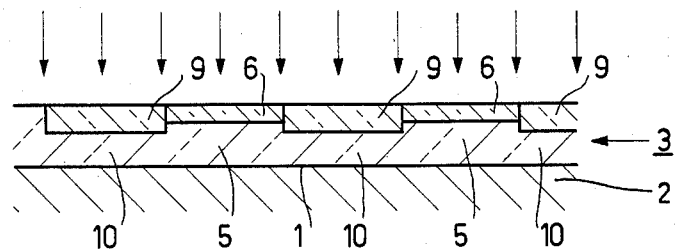
Figure 9:
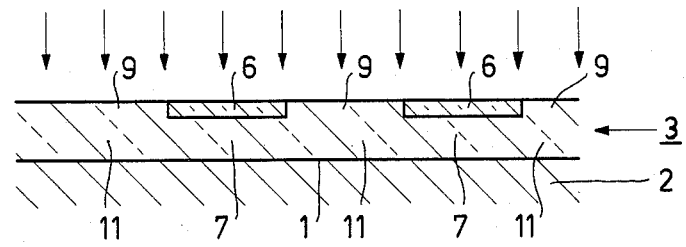
Figure 10:
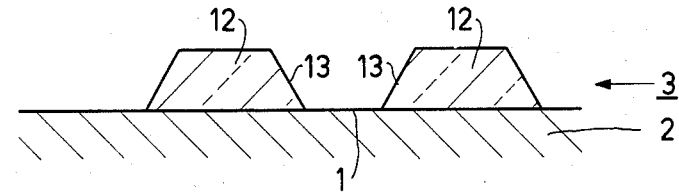
Figure 11:
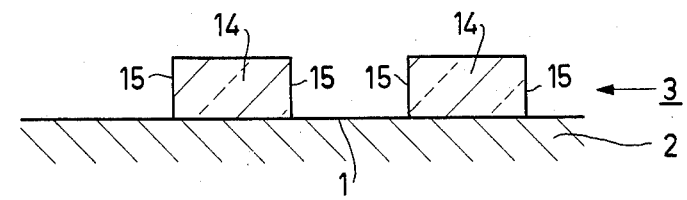
Figure 12:
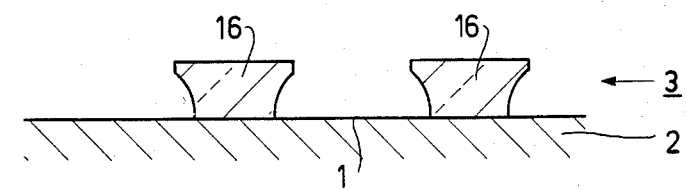

The invention will be described hereinafter more fully by way of example with reference to some embodiments and drawings. In the drawings:

FIG. 1 to FIG. 6 show various stages of carrying out the method in accordance with the invention, FIG. 7 to FIG. 9 show various stages of carrying out a preferred embodiment of the method in accordance with the invention, and FIGS. 10, 11 and 12 show lacquer patterns of different profiles, which can be realised with the aid of the method in accordance with the invention.

FIGS. 1 to 6 show various successive stages of the manufacture of a device, in which a photosensitive lacquer layer 3 is formed on a substrate surface 1 of, for example, a silicon substrate 2. The lacquer layer 3 is applied in a conventional manner and is then heated in a conventional manner for, for example, 30 minutes at a temperature of approximately 100° C. The photosensitive lacquer layer 3, which can be developed in a lye solution, and which comprises a polymeric material, such as "Novolak", and a sensitizer with a diazo group and a ketone group (for example, HPR 204 marketed by Hunt or AZ 135° J. marketed by Shiply), is then exposed to patterning irradiation (see FIG. 2).

Before a lacquer layer pattern is formed by development in a lye solution, the entire lacquer layer 3 is subjected—in accordance with the invention—to an intermediate treatment, which results in that differences in solubility in lye are obtained in the direction of thickness in parts 5 of the lacquer layer 3, which were not exposed during the patterning irradiation. During the intermediate treatment, the parts 4 of the lacquer layer 3—where the sensitizer has been wholly consumed—are not influenced by a first irradiation (see FIG. 3), but an ester compound is formed between the polymeric material and the sensitizer in a top layer 6 of the parts 5 that had not previously been irradiated. By a second irradiation (see FIG. 4), at least a part of the sensitizer is then converted into an acid in the parts 7 of the lacquer layer 3 lying below the top layer 6. Due to the first irradiation the solubility in lye of the top layer 6 has decreased; if, for example, the solubility was 50 Å/min before irradiation, it now becomes, for example, 5 Å/min. Due to the second irradiation, the solubility in lye of the parts 7 of the lacquer layer 3 lying below the top layer 6 has increased the solubility, which before irradiation was 50/Å/min, can increase, when the sensitizer has been entirely converted, to approximately 80,000 Å/min. Since due to the first irradiation the sensitizer in the top layer 6 has been bonded and hence has disappeared, the solubility in the top layer 6 cannot change any more during the second irradiation. Thus, differences in solubility in lye are obtained in the layer 3 in the direction of thickness.

After the intermediate treatment, the lacquer layer is developed in, for example, LSI developer marketed by Hunt. Dependent upon the irradiation doses of the first and the second irradiations—the first irradiation determines the thickness of the top layer 6 and the second irradiation determines the solubility of the parts 7—both vertical (see FIG. 5) and overhanging (see FIG. 6) lacquer profiles can be realized.

The first irradiation is carried out with UV radiation which substantially does not comprise radiation of wavelengths larger than 280 nm, such as the UV radiation supplied by low-pressure Hg lamps having a lamp vessel of quartz glass transparent to this radiation, and which mainly comprises radiation of a wavelength of 254 nm. During the first irradiation, the lacquer layer is substantially anhydrous, which can be achieved, for example, by heating the lacquer layer for approximately 5 minutes at 110° C. The sensitizer activated by the radiation then reacts with the "Novolak" to form an ester. Short-wave UV radiation is absorbed in substantially the same manner in parts 4 and 5 of the lacquer layer 3 exposed and not exposed, respectively, to patterning irradiation so that only the top layer 6 is formed. With an irradiation with radiation to which the exposed parts 4 are transparent, the top layer 6 could extend down to the substrate surface 1 along the boundaries 8 (FIG. 3) of parts 4 and 5 exposed and not exposed, respectively, to the patterning irradiation, as a result of which the lacquer profiles would not be influenced in the desired manner. In this case, perpendicularly incident parallel radiation would have to be used both with the patterning irradiation and with the first irradiation.

The second irradiation is carried out with UV radiation which mainly comprises radiation of wavelengths larger than 280 nm, such as is supplied, for example, by high-pressure Hg lamps. During this irradiation, the lacquer layer is in contact with a water-containing atmosphere, such as normal air of normal air humidity. In this manner, the sensitizer activated by the radiation with the water then present in the lacquer layer 3 to form an acid.

Preferably, during the intermediate treatment between the first and the second irradiation a part of the sensitizer present below the top layers 6 in the lacquer layer 3 is decomposed by means of a heat treatment. In this manner, the heat treatment determines the quantity of sensitizer that can still be converted into acid by the second irradiation. This means that the heat treatment determines the degree of solubility in lye when during the second irradiation the remaining quantity of sensitizer is converted into acid. In a lacquer layer, undesired differences in solubility can be obtained with short irradiation times due to standing waves. Since in this case the solubility in lye is determined by the heat treatment, the time of irradiation of the second irradiation can be chosen to be so long that such standing wave effects are avoided when the whole quantity of sensitizer has been converted. As will still appear, this heat treatment may be carried out at approximately 120° C. for approximately 30 minutes, after which approximately 35% of the sensitizer is left.

Figure 4:
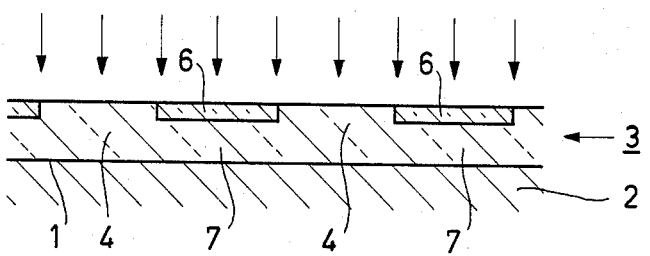
Figure 5:
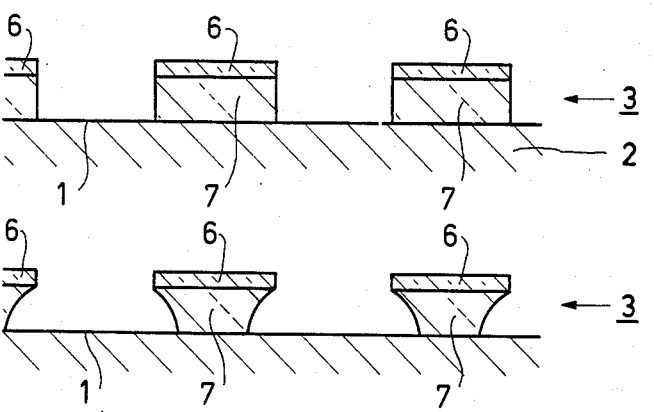
Figure 6:
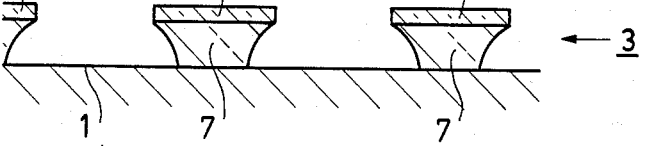

During the patterning irradiation of the lacquer layer 3, in a preferred embodiment of the method, only a surface part 9 thereof is rendered developable (FIG. 7). During the first irradiation (FIG. 8), the top layer 6 is formed. The parts 10 of the lacquer layer located below the surface parts 9 thus formed are converted, like the parts 5 lying below the top layer 6 and obtained in the intermediate treatment, during the second irradiation into parts 11 and 7, respectively, soluble in lye (FIG. 9). After the intermediate treatment, the same situation as that shown in FIG. 4 is thus obtained. It is attained by this measure that the patterning irradiation can be carried out in a time shorter than usual or that it can be carried out with radiation which is absorbed more strongly than conventional in the lacquer layer. In the first case, this means a more efficient use of the exposure apparatus and in the second case that radiation of shorter wavelength can be used, with which smaller details can be realized.

In all the following examples, a photosensitive lacquer layer 3 having a thickness of 1.25 μm—HPR 204 marketed by Hunt—is applied in a conventional manner to a silicon substrate 2, while before the patterning irradiation a heat treatment of approximately 10 minutes at a temperature of approximately 100° C.—"pre-bake"—was carried out. The patterning irradiation was effected in a Perkin Elmer projection printer 1:1 type 120. The mask used therein exhibited lines having a width of 2 μm at a relative distance of likewise 2 μm.

EXAMPLE 1

In this example, the lacquer layer 3 exposed to a patterning irradiation was developed without an intermediate treatment for 1 minute at 20° C. in an L.S.I. developer diluted with water in a ratio 1:1 (marketed in Hunt).

The lacquer patterns thus obtained have profiles 12 (see FIG. 10) with sides 13 which enclose with the substrate surface 1 angles of approximately 65°.

EXAMPLE 2

In this example, the lacquer layer 3 exposed to patterning irradiation was subjected to an intermediate treatment, in which first the lacquer layer was rendered substantially anhydrous by a heat treatment in a vacuum of approximately 13 Pa (0.1 Torr) at a temperature of approximately 90° C. Susequently, a first irradiation was carried out for approximately 60 minutes with a 50 W low-pressure Hg lamp having a quartz glass lamp vessel, which lamp mainly emits 254 nm radiation with a distance between the lamp and the substrate surface of 20 cm. A second irradiation was then carried out for approximately 2 seconds with a 500 W high-pressure Hg lamp having a glass lamp vessel, which lamp mainly emits radiation of wave-lengths larger than 280 nm with a distance between the lamp and the substrate surface of 100 cm. The second irradiation was carried out under normal atmospheric conditions. Subsequently, the lacquer layer was developed for 120 seconds in an L.S.I. developer diluted with water in a ratio 1:2. The lacquer patterns thus obtained had profiles 14 (see FIG. 11) with sides 15 extending a right angles to the substrate surface 1.

EXAMPLE 3

In this example, the same method as in Example 2 was used with the difference that the second irradiation was carried out for approximately 4 seconds. In this example, lacquer patterns (see FIG. 12) with overhanging profiles 16 were obtained, which are particularly suitable for the application of metal patterns by means of "lift-off" techniques.

EXAMPLE 4

In this example, the same method—with the same result—was used as in Example 2 with the difference that now the lacquer layer 3 was rendered substantially anhydrous before the first irradiation by a heat treatment at a normal pressure for 5 minutes at a temperature of approximately 120° C., after which the first irradiation was carried out for 5 minutes with a 1000 W low-pressure Hg lamp—which mainly emits 254 nm radiation—with a distance between the lamp and the substrate surface of 40 cm.

EXAMPLE 5

In this example, the same method was used as in Example 4 only with the difference that in this case the second irradiation was preceded by a heat treatment for approximately 60 seconds at a temperature of approximately 120° C., after which the second irradiation was carried out for 30 seconds with the 500 W high-pressure Hg lamp at a distance of 25 cm. In this example, lacquer patterns were obtained with profiles 14, as in Example 2 (FIG. 11).

EXAMPLE 6

In this example, again the same method was used as in Example 2 with the difference that the patterning irradiation was carried out for ¼ of the usual irradiation time. In this example, lacquer patterns with profiles 14 as in Example 2 (FIG. 11) were realised.

EXAMPLE 7

In this example, the same method was used as in Example 2 with the difference that the patterning irradiation was carried out with comparatively short-wave radiation which penetrates only superficially into the lacquer layer 3. This irradiation was carried out with an O.A.E. deep UV Illuminator marketed by Optical-Associates Inc. with a 500 W Xe/Hg lamp. Also in this example, lacquer patterns with profiles 14 as in Example 2 (FIG. 11) were realised.

It should further be appreciated that the invention is not limited to the embodiments, but that within the scope of the invention many variations are possible for those skilled in the art. Thus, for example, the lacquer layer may be applied to a substrate which consists of a single material other than silicon or of a combination of materials. Further the lacquer layer may be applied to a substrate having a non-planar surface. In this case, the lacquer layer and also the lacquer pattern formed after development may exhibit local differences in thickness. The lacquer pattern then obtained is particularly suitable to be used as an etching mask during etching with reactive ions.

What is claimed is:

1. A method of manufacturing a semiconductor device comprising the steps of
    forming a photoresist lacquer layer on a substrate surface, said lacquer layer including a polymeric material and a sensitizer having a diazo group and a ketone group,
    exposing said lacquer layer to patterning irradiation,
    subjecting the entire area of said lacquer layer to an intermediate treatment, said intermediate treatment including a first irradiation of said lacquer layer to form a bond between said sensitizer and said polymeric material, and a second irradiation of said lacquer layer to convert at least a part of said sensitizer into an acid in parts of said lacquer layer lying below the top layer, and developing said lacquer layer in a lye solution, wherein said intermediate treatment causes differences in solubility in lye in the direction of thickness in unexposed parts of said lacquer layer.

2. A method according to claim 1, wherein said first irradiation is carried out with UV radiation at wavelengths not larger than 280 nm, said lacquer layer being substantially anhydrous during said first irradiation.

3. A method according to claim 2, wherein said second irradiation is carried out with UV radiation at wavelengths larger than 280 nm, said lacquer layer being in contact with a water-containing atmosphere during said second irradiation.

4. A method according to claim 3, wherein between said first and second irradiation, portions of said lacquer layer below the top layer are decomposed by a heat treatment.

5. A method according to claim 3, wherein during said patterning irradiation, only surface parts of said lacquer layer are rendered developable.

6. A method according to claim 2, wherein between said first and second irradiation, portions of said lacquer layer below the top layer are decomposed by a heat treatment.

7. A method according to claim 2, wherein during said patterning irradiation, only surface parts of said lacquer layer are rendered developable.

8. A method according to claim 1, wherein said second irradiation is carried out with UV radiation at wavelengths larger than 280 nm, said lacquer layer being in contact with a water-containing atmosphere during said second irradiation.

9. A method according to claim 1, wherein during said patterning irradiation, only surface parts of said lacquer layer are rendered developable.

* * * * *